(12) United States Patent
Otremba et al.

(10) Patent No.: US 9,147,637 B2
(45) Date of Patent: Sep. 29, 2015

(54) MODULE INCLUDING A DISCRETE DEVICE MOUNTED ON A DCB SUBSTRATE

(75) Inventors: Ralf Otremba, Kaufbeuren (DE); Roland Rupp, Lauf (DE); Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 665 days.

(21) Appl. No.: 13/336,248

(22) Filed: Dec. 23, 2011

(65) Prior Publication Data
US 2013/0161801 A1    Jun. 27, 2013

(51) Int. Cl.
*H01L 23/02* (2006.01)
*H01L 23/48* (2006.01)
(Continued)

(52) U.S. Cl.
CPC ............... *H01L 23/48* (2013.01); *H01L 23/24* (2013.01); *H01L 23/3135* (2013.01); *H01L 23/3735* (2013.01); *H01L 23/49524* (2013.01); *H01L 23/49562* (2013.01); *H01L 23/49575* (2013.01); *H01L 23/49811* (2013.01); *H01L 24/40* (2013.01); *H01L 24/41* (2013.01); *H01L 24/73* (2013.01); *H01L 23/3107* (2013.01); *H01L 24/05* (2013.01); *H01L 24/06* (2013.01); *H01L 24/29* (2013.01); *H01L 24/32* (2013.01); *H01L 24/37* (2013.01); *H01L 24/45* (2013.01); *H01L 24/48* (2013.01); *H01L 24/83* (2013.01); *H01L 24/84* (2013.01); *H01L 24/85* (2013.01); *H01L 24/92* (2013.01); *H01L 2224/04026* (2013.01); *H01L 2224/04034* (2013.01); *H01L 2224/04042* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/0603* (2013.01); *H01L 2224/06181* (2013.01); *H01L 2224/2929* (2013.01); *H01L 2224/29111* (2013.01); *H01L 2224/29139* (2013.01); *H01L 2224/29144* (2013.01); *H01L 2224/29147* (2013.01); *H01L 2224/29339* (2013.01); *H01L 2224/29344* (2013.01); *H01L 2224/29347* (2013.01); *H01L 2224/29355* (2013.01);
(Continued)

(58) Field of Classification Search
CPC ............... H01L 23/3735; H01L 23/48; H01L 23/49524; H01L 23/49562; H01L 23/49575; H01L 23/49811; H01L 24/40; H01L 24/41; H01L 24/73
USPC ........... 257/668, E21.502, E23.052; 361/813; 438/123
See application file for complete search history.

(56) References Cited

U.S. PATENT DOCUMENTS

| | | |
|---|---|---|
| 7,135,761 B2 | 11/2006 | Carney et al. |
| 7,271,470 B1 | 9/2007 | Otremba |

(Continued)

FOREIGN PATENT DOCUMENTS

| | | |
|---|---|---|
| CN | 1790697 A | 6/2006 |
| CN | 101030570 A | 9/2007 |

(Continued)

*Primary Examiner* — Vongsavanh Sengdara
(74) *Attorney, Agent, or Firm* — Slater & Matsil, L.L.P.

(57) ABSTRACT

A module includes a DCB substrate and a discrete device mounted on the DCB substrate, wherein the discrete device comprises a leadframe, a semiconductor chip mounted on the leadframe and an encapsulation material covering the semiconductor chip.

12 Claims, 13 Drawing Sheets

(51) Int. Cl.
*H01L 23/24* (2006.01)
*H01L 23/373* (2006.01)
*H01L 23/495* (2006.01)
*H01L 23/498* (2006.01)
*H01L 23/00* (2006.01)
*H01L 23/31* (2006.01)

(52) U.S. Cl.
CPC ............ *H01L 2224/32145* (2013.01); *H01L 2224/32225* (2013.01); *H01L 2224/32245* (2013.01); *H01L 2224/3716* (2013.01); *H01L 2224/3766* (2013.01); *H01L 2224/37124* (2013.01); *H01L 2224/37147* (2013.01); *H01L 2224/37155* (2013.01); *H01L 2224/37639* (2013.01); *H01L 2224/37647* (2013.01); *H01L 2224/37655* (2013.01); *H01L 2224/4005* (2013.01); *H01L 2224/40137* (2013.01); *H01L 2224/40227* (2013.01); *H01L 2224/40247* (2013.01); *H01L 2224/41051* (2013.01); *H01L 2224/45015* (2013.01); *H01L 2224/45124* (2013.01); *H01L 2224/4847* (2013.01); *H01L 2224/48091* (2013.01); *H01L 2224/48227* (2013.01); *H01L 2224/48247* (2013.01); *H01L 2224/48463* (2013.01); *H01L 2224/48464* (2013.01); *H01L 2224/73221* (2013.01); *H01L 2224/73263* (2013.01); *H01L 2224/73265* (2013.01); *H01L 2224/8381* (2013.01); *H01L 2224/8382* (2013.01); *H01L 2224/83191* (2013.01); *H01L 2224/83192* (2013.01); *H01L 2224/83801* (2013.01); *H01L 2224/83851* (2013.01); *H01L 2224/8482* (2013.01); *H01L 2224/8485* (2013.01); *H01L 2224/84801* (2013.01); *H01L 2224/85447* (2013.01); *H01L 2224/92247* (2013.01); *H01L 2924/014* (2013.01); *H01L 2924/01327* (2013.01); *H01L 2924/10253* (2013.01); *H01L 2924/10271* (2013.01); *H01L 2924/10272* (2013.01); *H01L 2924/10329* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/14* (2013.01); *H01L 2924/141* (2013.01); *H01L 2924/1431* (2013.01); *H01L 2924/1434* (2013.01); *H01L 2924/1461* (2013.01); *H01L 2924/19105* (2013.01)

(56) References Cited

U.S. PATENT DOCUMENTS

| | | | |
|---|---|---|---|
| 7,569,920 | B2 | 8/2009 | Otremba et al. |
| 7,589,412 | B2 | 9/2009 | Kashimoto et al. |
| 7,800,208 | B2 | 9/2010 | Otremba |
| 7,851,908 | B2 | 12/2010 | Otremba et al. |
| 7,880,280 | B2 | 2/2011 | Otremba |
| 7,880,288 | B2 | 2/2011 | Otremba |
| 2008/0017882 | A1 | 1/2008 | Nakanishi et al. |
| 2009/0104734 | A1* | 4/2009 | Specht et al. ............... 438/117 |
| 2009/0140399 | A1* | 6/2009 | Schulz et al. ............... 257/660 |
| 2010/0068552 | A1* | 3/2010 | Goerlich et al. ............ 428/615 |
| 2010/0075444 | A1* | 3/2010 | Arai et al. .................. 438/17 |
| 2010/0127383 | A1 | 5/2010 | Oka et al. |

FOREIGN PATENT DOCUMENTS

| | | |
|---|---|---|
| CN | 101459164 A | 6/2009 |
| CN | 102201396 A | 9/2011 |
| DE | 103 01 091 A1 | 7/2004 |
| DE | 10 2007 022 428 A1 | 11/2007 |
| DE | 10 2007 012 154 A1 | 9/2008 |
| DE | 10 2008 006 835 A1 | 9/2008 |
| DE | 10 2008 027 703 A1 | 1/2009 |
| DE | 10 2008 051 965 A1 | 7/2009 |

* cited by examiner

MODULE INCLUDING A DISCRETE DEVICE MOUNTED ON A DCB SUBSTRATE

TECHNICAL FIELD

This invention relates to a module including a discrete device mounted on a DCB substrate and a method of manufacturing thereof.

BACKGROUND

In semiconductor modules unpackaged semiconductor chips including integrated circuits are often mounted on DCB (direct copper bonding) substrates directly. Bond wires made of aluminum are used to couple the contact pads of the semiconductor chips to the DCB substrate. Due to the fact that the bond wires are easily damaged during the production and operation of such modules, the bond wires limit the manufacturing yield and operating time of the modules.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Discrete devices containing semiconductor chips, in particular, power semiconductor chips, are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its top side and bottom side. In particular, power semiconductor chips may have a vertical structure and have load electrodes on both main faces. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors) or power bipolar transistors. By way of example, the source electrode and gate electrode of a power MOSFET may be situated on one face, while the drain electrode of the power MOSFET is arranged on the other face. In addition, the devices described below may include integrated circuits to control the integrated circuits of the power semiconductor chips.

The semiconductor chips have contact pads (or contact elements or terminals) which allow electrical contact to be made with the integrated circuits included in the semiconductor chips. The contact pads may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The devices described below may be provided in a discrete form having two or more electrical terminals. The electrical terminals of the discrete devices are intended to be connected to a DCB substrate, for example, by soldering. The discrete devices include one or more semiconductor chips, which may be mounted on a leadframe. The leadframe includes die pads and leads. Both the die pads and the leads may form the electrical terminals of the discrete devices. In addition, the semiconductor chips or at least parts of the semiconductor chips may be packaged by covering the semiconductor chips with an encapsulation material, which may be electrically insulating and which may form an encapsulation body. The encapsulation material may be any appropriate duroplastic, thermoplastic or thermosetting material or laminate (prepreg) and may contain filler materials. Various techniques may be employed to encapsulate the semiconductor chips with the encapsulation material, for example compression molding, injection molding, powder molding, liquid molding or lamination.

The discrete devices are mounted on DCB (direct copper bonding) substrates. A DCB substrate includes a ceramic substrate, for example, made of aluminum oxide. Copper layers are deposited on the upper and lower surfaces of the ceramic substrate. The copper layers may also be structured in order to form conductor tracks.

The modules described below include external contact elements (or external contact pads), which may be of any shape and size. The external contact elements may be accessible from outside the modules and may thus allow electrical contact to be made with the semiconductor chips from outside the modules. Furthermore, the external contact elements may be thermally conducting and may serve as heat sinks for dissipating the heat generated by the semiconductor chips. The external contact elements may be composed of any desired electrically conductive material, for example, of a metal, such as copper, aluminum or gold, or a metal alloy. The external contact elements may be formed by portions of metal clips. Solder material, such as solder balls or solder bumps, may be deposited on the external contact elements.

Each of the modules has at least one mounting surface. The mounting surface serves to mount the module onto another component, for example, a circuit board, such as a PCB (printed circuit board). External contact elements and, in particular, external contact surfaces are disposed on the mounting surface to allow to electrically couple the module to the component on which the module is mounted. Solder deposits, such as solder balls, or other appropriate connection elements may be used to establish an electrical and, in particular, mechanical connection between the module and the component on which the module is mounted.

Figure 1:
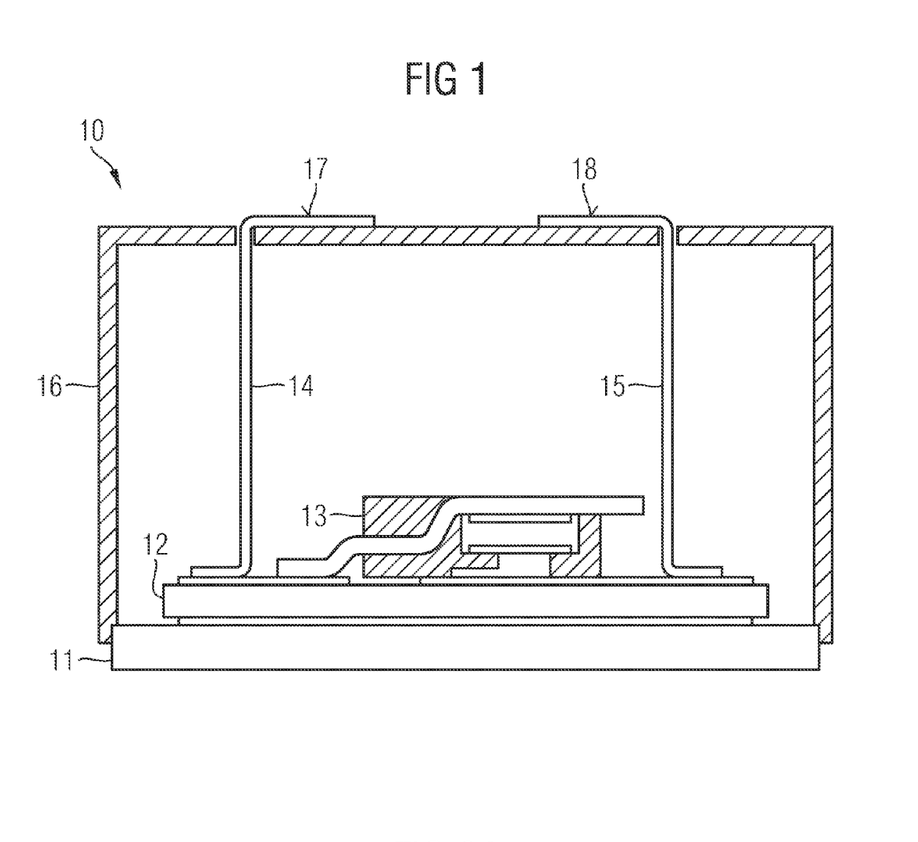
FIG. 1 schematically illustrates a cross-sectional view of one embodiment of a module including a discrete device mounted on a DCB substrate.

FIG. 1 schematically illustrates a cross-sectional view of a module 10. The module 10 includes a metal carrier 11, a DCB substrate 12 mounted on the metal carrier 11 and a discrete device 13 mounted on the DCB substrate 12. In addition, metal clips 14, 15 are mounted on the DCB substrate 12, and a housing 16 is placed over the metal carrier 11 accommodating the DCB substrate 12 and the discrete device 13. Surfaces 17, 18 of the metal clips 14, 15 serve as external contact elements.

Figure 2A:
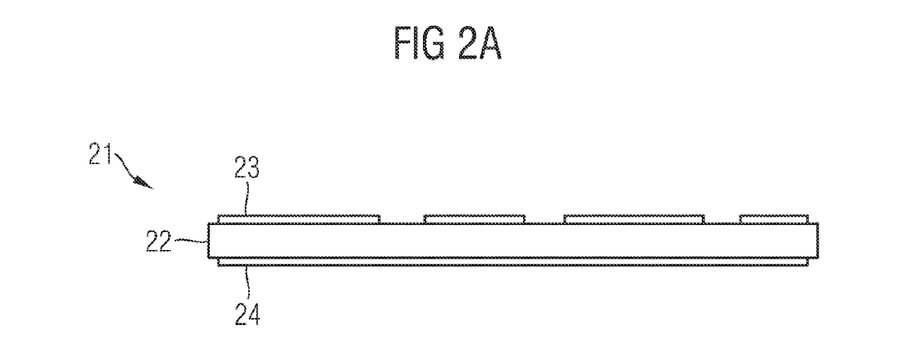
FIGS. 2A-2G schematically illustrate a cross-sectional view of one embodiment of a method including mounting a discrete device on a DCB substrate, mounting the DCB substrate on a metal carrier and placing a housing on the metal carrier.
Figure 2B:
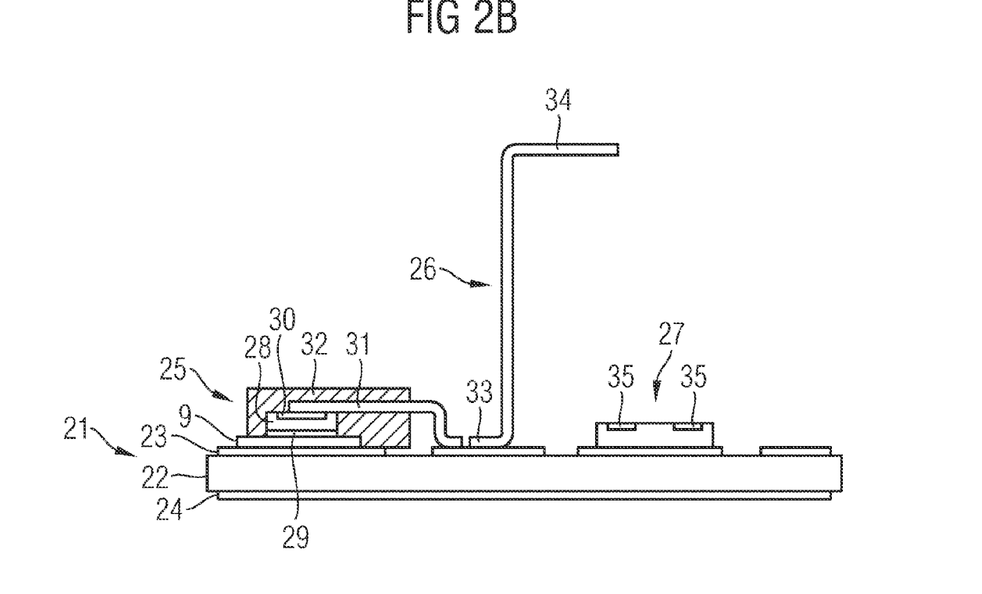
Figure 2C:
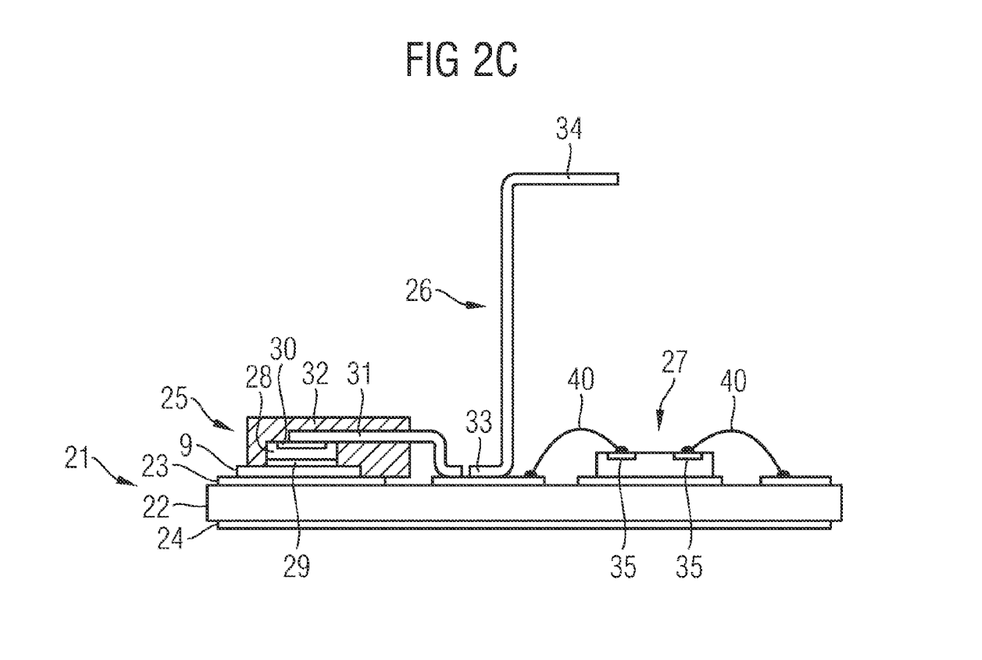
Figure 2D:
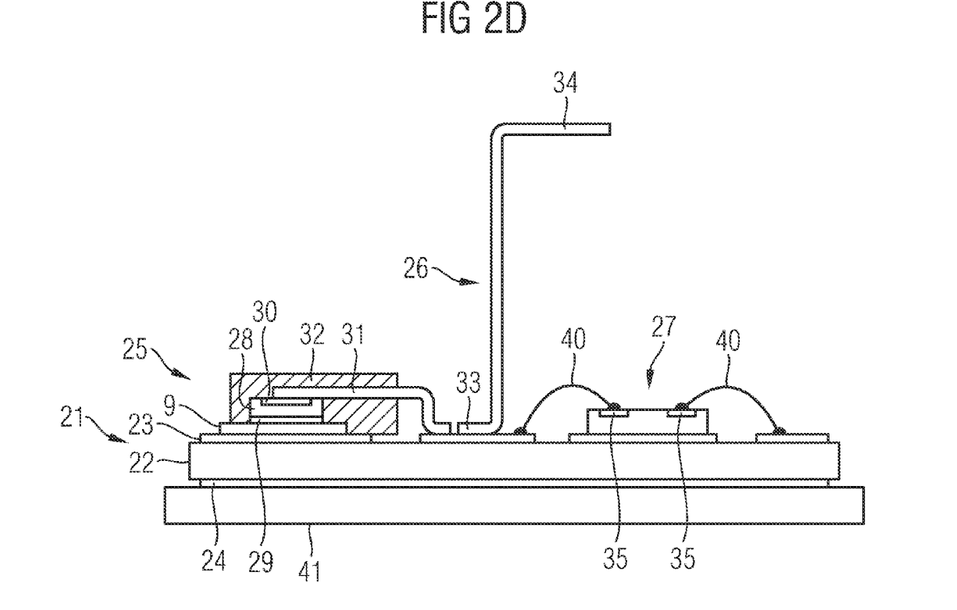
Figure 2E:
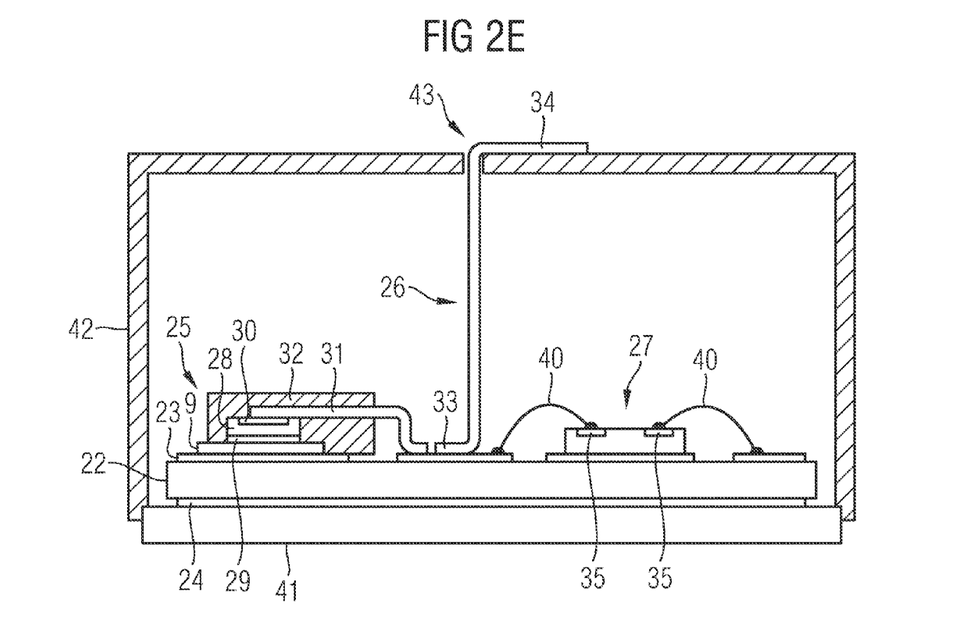
Figure 2F:
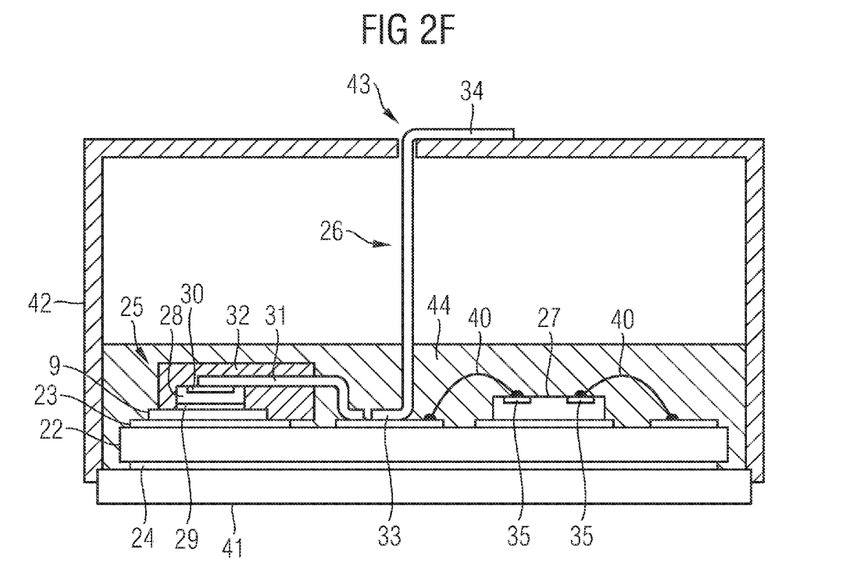
Figure 2G:
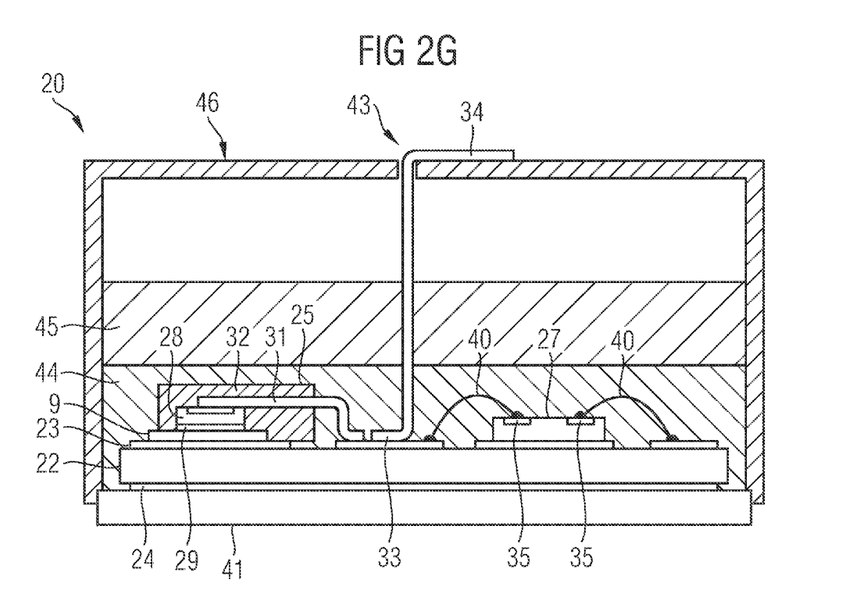

FIGS. 2A-2G, collectively FIG. 2, schematically illustrate an embodiment of a method of manufacturing a module 20, which is illustrated in FIG. 2G.

FIG. 2A schematically illustrates a DCB substrate 21. The DCB substrate 21 consists of a ceramic substrate 22, which is, for example, made of aluminum oxide. Copper layers 23, 24 are deposited on the upper and lower surfaces of the ceramic substrate 22, respectively. At least the copper layer 23 on the upper surface of the ceramic substrate 22 is structured, whereby the copper layer 23 is divided into copper pads that are electrically insulated from each other.

FIG. 2B schematically illustrates a discrete device 25, a metal clip 26 and a semiconductor chip 27 mounted on the copper pads of the copper layer 23. The discrete device 25 has been pre-fabricated before mounting the discrete device 25 on the DCB substrate 21. In one embodiment, the discrete device 25 has been tested before the discrete device 25 is mounted on the DCB substrate 21. The discrete device 25 includes a packaged semiconductor chip 28, which is a power semiconductor chip and has a first contact pad 29 on its lower surface and a second contact pad 30 on its upper surface. In one embodiment, the first and second contact pads 29, 30 are load electrodes and a third contact pad, which serves as a control electrode and is not illustrated in FIG. 2B, is arranged on the upper surface of the semiconductor chip 28. The semiconductor chip 28 is mounted on a leadframe 9 with the first contact pad 29 facing the leadframe 9. One end of a metal clip 31 is attached to the second contact pad 30. An encapsulation material 32 covers at least portion of the semiconductor chip 28, the leadframe 9 and the metal clip 31. The other end of the metal clip 31, which is not attached to the second contact pad 30, and the lower surface of the leadframe 9 form terminals of the discrete device 25, which are used to electrically and mechanically couple the discrete device 25 to the copper layer 23.

The metal clip 26 has an end 33 which is attached to the copper layer 23 and an end 34 which serves as an external contact element later on. The metal clip 26 is made of an appropriate metal or metal alloy, for example, copper or aluminum.

The semiconductor chip 27 is unpackaged and is placed on the copper layer 23 directly. The semiconductor chip 27 has contact pads 35 on its upper surface. The semiconductor chip 27 is glued to the copper layer 23.

In one embodiment, the discrete device 25 and the metal clip 26 are electrically and mechanically coupled to the DCB substrate 21 by diffusion soldering. For that, a solder material is deposited on the terminals of the discrete device 25 and the end 33 of the metal clip 26. In one embodiment, the solder material consists of AuSn, AgSn, CuSn, Sn, AuIn, AgIn, AuSi or CuIn.

In one embodiment, the DCB substrate 21 together with the discrete device 25 and the metal clip 26 are placed in an oven and is heated to an appropriate temperature in order to melt the solder material. During the soldering process the discrete device 25 and the metal clip 26 may be pressed on the DCB substrate 21. The solder material then produces metallic joints between the terminals of the discrete device 25, the metal clip 26 and the pads of the copper layer 23, which are able to withstand high temperatures through the fact that the solder material forms a temperature-resistant and highly mechanically stable intermetallic phase with high-melting materials of the terminals of the discrete device 25, the metal clip 26 and the copper layer 23. The intermetallic phase has a higher melting temperature than the solder material used to generate the intermetallic phase. In the process, the lowmelting solder material is completely transformed, i.e., it passes completely into the intermetallic phase.

FIG. 2C schematically illustrates bond wires 40 which electrically couple the contact pads 35 of the semiconductor chip 27 to pads of the copper layer 23.

FIG. 2D schematically illustrates a metal carrier 41. For mechanical stabilization and heat removal, the DCB substrate 21 is mounted on the metal carrier 41, for example, by soldering the copper layer 24 to the upper surface of the metal carrier 41. During operation of the module 20, the metal carrier 41 may transfer the heat loss to a cooling system. The metal carrier 41 is made of an appropriate metal or metal alloy, for example, copper.

FIG. 2E schematically illustrates a housing 42 placed on the metal carrier 41 and accommodating the DCB substrate 21 together with the discrete device 25 and the semiconductor chip 27. The housing 42 has an opening 43 which allows the upper end 34 of the metal clip 26 to be outside of the housing 42, where it can serve as an external contact element. The housing 42 may be made of plastics.

FIG. 2F schematically illustrates a silicone gel 44 which is deposited on the DCB substrate 21 and covers the discrete device 25, the lower portion of the metal clip 26, the semiconductor chip 27 and the bond wires 40.

FIG. 2G schematically illustrates an epoxy resin 45 which is deposited on the silicone gel 44.

The module 20 as illustrated in FIG. 2G includes only one discrete device 25. In one embodiment, further discrete devices similar to the device 25 are mounted on the DCB substrate 21. One or more of the semiconductor chips included in these discrete devices are made of a silicon carbide (SiC) substrate. In addition, other unpackaged semiconductor chips similar to the semiconductor chip 27 may be attached directly to the DCB substrate 21. In one embodiment, all semiconductor chips included in the discrete devices are made of a silicon carbide substrate, and all unpackaged semiconductor chips mounted on the DCB substrate 21 directly are made of a silicon substrate. In one embodiment, only discrete devices are included in the module 20 and no unpackaged semiconductor chips are mounted directly on the DCB substrate 21.

In FIG. 2G only one metal clip 26 is shown which serves as an external contact element. However, it is obvious that further metal clips like the metal clip 26 may be provided which are attached to the copper layer 23 and which have portions that are located at a surface 46 of the housing 42 to serve as external contact elements in order to allow access to the discrete devices and semiconductor chips included in the module 20. The surface 46 may be used as a mounting surface to mount the module 20 onto another component, for example, a circuit board, such as a PCB (printed circuit board).

Since the power semiconductor chip 28 is included in the discrete device 25, no bond wires are necessary to couple the power semiconductor chip 28 to the DCB substrate 21. This increases the manufacturing yield and operating time of the module 20. Further, the metal clip 31 improves the performance of the discrete device 25 regarding conducting-state losses and switching losses. In addition, if bond wires are used within the discrete device 25, the stability and performance of the device 25 are improved, in particular, for chip areas smaller than 10 mm$^2$ and bond wires thinner than 100 µm.

It is obvious that other discrete devices than the discrete device 25 shown in FIG. 2G may be mounted on the DCB substrate 21. FIGS. 3A-3F schematically illustrate a cross-sectional view of one embodiment of a method to fabricate a device 30 as illustrated in FIG. 3F, which can be included in a module similar to the module 20.

Figure 3A:
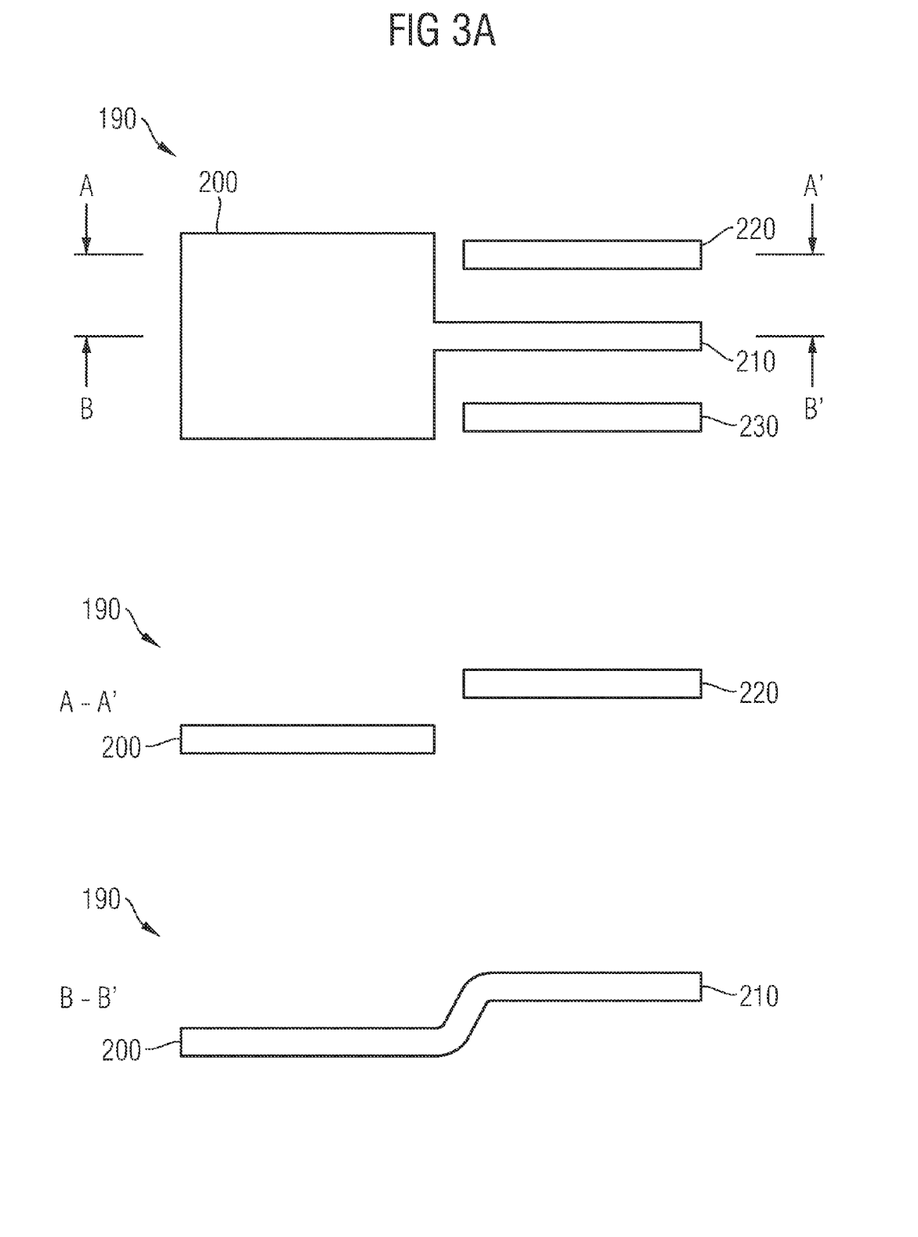
FIGS. 3A-3F schematically illustrate a cross-sectional view of one embodiment of a method including mounting a semiconductor chip on a leadframe and covering the semiconductor chip with an encapsulation material to fabricate a discrete device.

FIG. 3A schematically illustrates a leadframe 190 in a top plan view (top), a cross-sectional view (middle) along the line A-A' depicted in the top plan view and a cross-sectional view (bottom) along the line B-B' depicted in the top plan view. The leadframe 190 includes a plurality of die pads 200, only one of them is illustrated in FIG. 3A. Three leads 210, 220 and 230 (or more leads) are assigned to each of the die pads 200. The leads 210, 220 and 230 may protrude essentially in parallel from one side of the die pad 200. The lead 210 is contiguous with one side of the die pad 200. The die pads 200 and the leads 210, 220 and 230 are linked by dams (tie bars), which are not illustrated in FIG. 3A for reasons of clarity. As illustrated in the cross-sectional views of FIG. 3A, the leads 210, 220 and 230 are arranged in a different plane than the die pad 200, but may alternatively be arranged in the same plane.

The leadframe 190 is manufactured from metals or metal alloys, in particular, copper, copper alloys, iron nickel, aluminum, aluminum alloys, or other electrically conductive materials. Furthermore, the leadframe 190 may be plated with an electrically conductive material, for example, copper, silver, iron nickel or nickel phosphorus. The shape of the leadframe 190 is not limited to any size or geometric shape. For example, the leadframe 190 may have a thickness in the range from 100 µm to 1 mm or may be even thicker. The leadframe 190 may have been manufactured by punching, milling or stamping a metal plate.

Figure 3B:
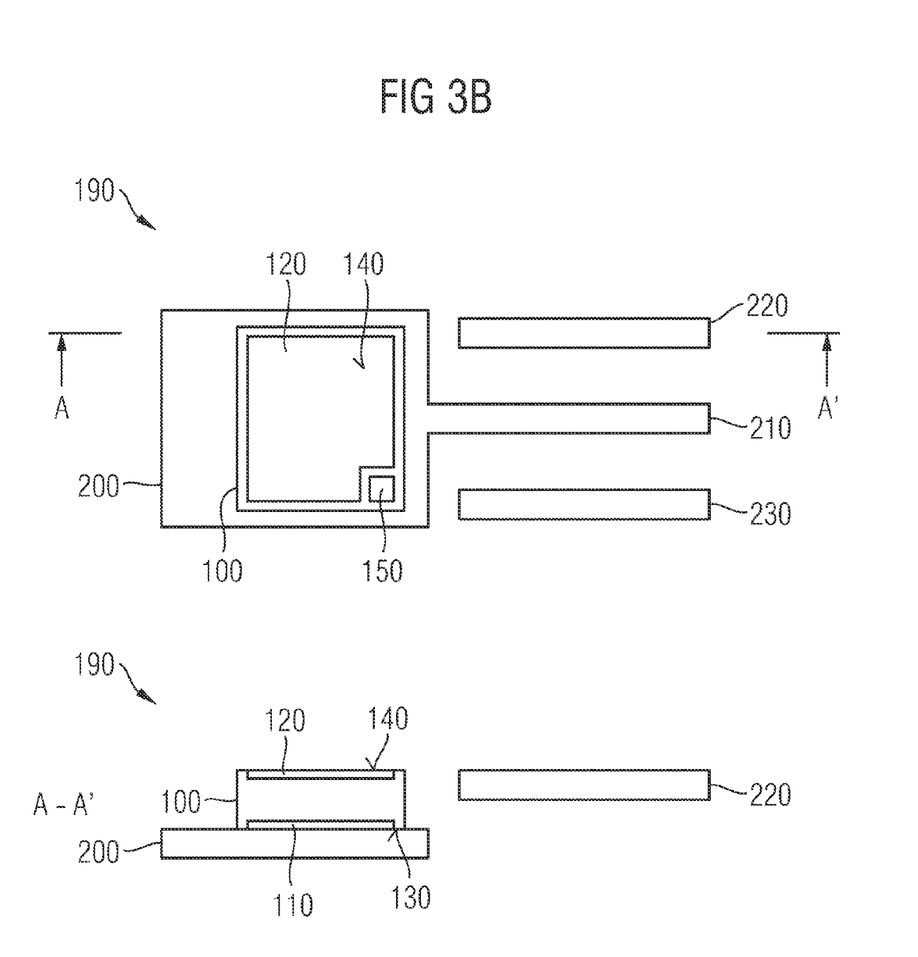

FIG. 3B schematically illustrates a power semiconductor chip 100 that is mounted on the die pad 200. Further semiconductor chips, which may also be power semiconductor chips, may be mounted on further die pads of the leadframe 190, which are not illustrated in FIG. 3B. The semiconductor chips may have been fabricated on a wafer made of semiconductor material and, in particular, on the same wafer, but may alternatively have been manufactured on different wafers. Furthermore, the semiconductor chips may be physically identical, but may also contain different integrated circuits.

The power semiconductor chip 100 is mounted on the die pad 200 with its first surface 130 facing the die pad 200. The power semiconductor chip 100 has a first electrode 110 on the first surface 130 and a second electrode 120 on a second surface 140. The first and second electrodes 110, 120 are load electrodes. Furthermore, the power semiconductor chip 100 has a third electrode 150 on its second surface 140. The third electrode 150 is a control electrode.

In one embodiment, the power semiconductor chip 100 is configured as a power transistor, for example a power MOSFET, IGBT, JFET or power bipolar transistor. In the case of a power MOSFET or a JFET, the first load electrode 110 is a drain electrode, the second load electrode 120 is a source electrode, and the control electrode 150 is a gate electrode. In the case of an IGBT, the first load electrode 110 is a collector electrode, the second load electrode 120 is an emitter electrode, and the control electrode 150 is a gate electrode. In the case of a power bipolar transistor, the first load electrode 110 is a collector electrode, the second load electrode 120 is an emitter electrode, and the control electrode 150 is a base electrode. During operation, voltages of up to 5, 50, 100, 500 or 1000 V or even higher may be applied between the load electrodes 110 and 120. The switching frequency applied to the control electrode 150 may be in the range from 1 kHz to 100 MHz, but may also be outside this range.

The first electrode 110 may be electrically coupled to the die pad 200 by diffusion soldering. For that, a solder material may be deposited on the first electrode 110 or the upper surface of the die pad 200 (not illustrated), for example, by sputtering or other appropriate physical or chemical deposition methods. The solder material may have a thickness in the range from 100 nm to 10 µm, in particular, in the range from 1 to 3 µm. During the soldering operation, the solder material diffuses into the adjacent materials which leads to an intermetallic phase at the interface between the power semiconductor chip 100 and the die pad 200. The solder material may, for example, consist of AuSn, AgSn, CuSn, Sn, AuIn, AgIn, AuSi or CuIn.

Instead of a diffusion soldering process, other connection techniques may be used to attach the power semiconductor chip 100 to the die pad 200, for example, soft soldering or adhesive bonding by means of an electrically conductive adhesive. When using a soft soldering process to join the power semiconductor chip 100 and the die pad 200 to each other, solder material remains at the interface between the power semiconductor chip 100 and the die pad 200 after the soldering process has been finished. In case of adhesive bonding, an electrically conductive adhesive may be used, which may be based on filled or unfilled polyimides, epoxy resins, acrylate resins, silicone resins or mixtures thereof and may be enriched with gold, silver, nickel or copper in order to produce electrical conductivity.

Figure 3C:
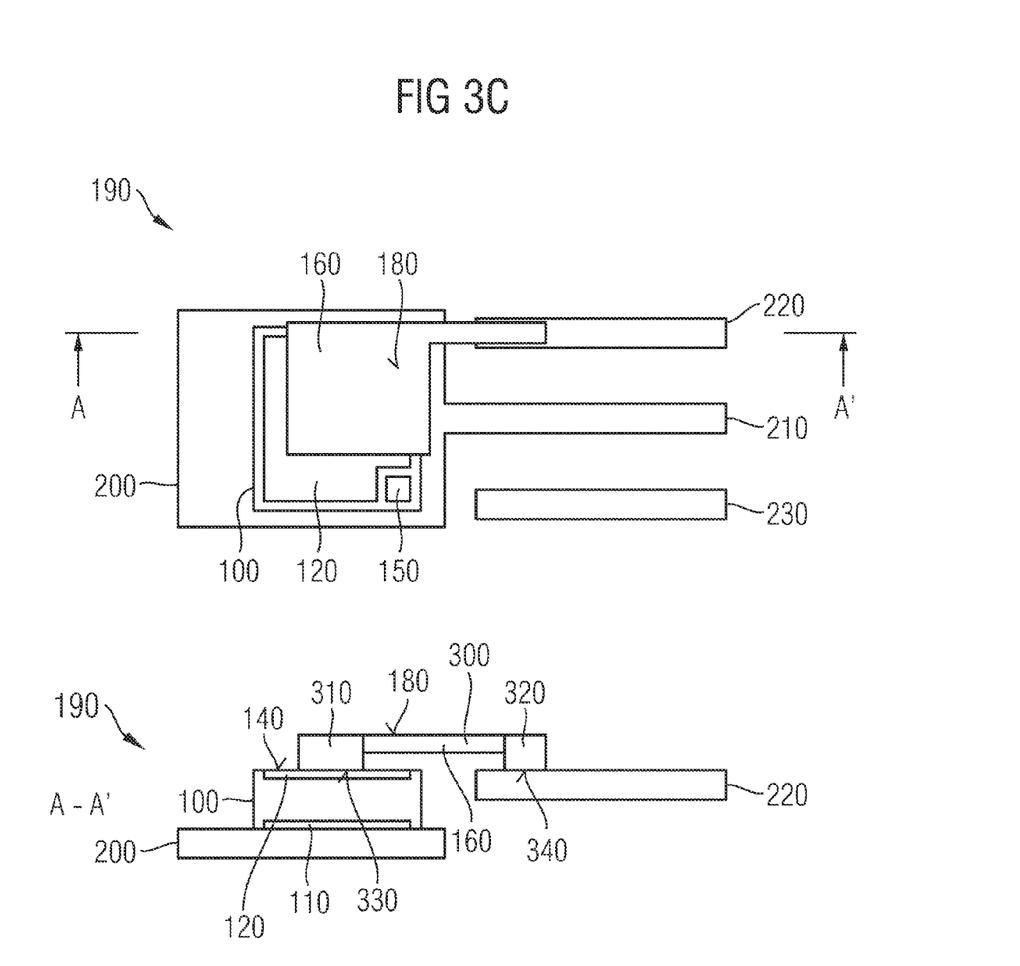

FIG. 3C schematically illustrates a metal clip 160 placed over the power semiconductor chip 100 and the lead 220. The metal clip 160 consists of three portions 300, 310 and 320 which are indicated in FIG. 3C by dashed lines. The portion 300 extends parallel to the upper surfaces of the power semiconductor chip 100 and the leadframe 190. The portions 310 and 320 extend essentially orthogonal to the portion 300. One end of the portion 310 has a contact surface 330, which is attached to the second electrode 120 of the power semiconductor chip 100. One end of the portion 320 has a contact surface 340, which is attached to the upper surface of the lead 220.

The metal clip 160 is manufactured from a metal or a metal alloy, in particular, copper, copper alloys, iron nickel, aluminum, aluminum alloys, or another electrically conductive materials. In one embodiment, the metal clip 160 is plated with an electrically conductive material, for example, copper, silver, iron nickel or nickel phosphorus. The shape of the metal clip 160 is not limited to any size or geometric shape. The metal clip 160 may have the shape as exemplarily illustrated in FIG. 3C, but any other shape is also possible. The metal clip 160 may have a thickness in the range from 100 µm to some millimeters or may be even thicker. The metal clip 160 may be fabricated by stamping, punching, pressing, cutting, sawing, milling or any other appropriate technique.

The metal clip 160 may be attached to the power semiconductor chip 100 and the lead 220 in a similar manner as the power semiconductor chip 100 has been attached to the die pad 200. For example, diffusion soldering, soft soldering or adhesive bonding by means of an electrically conductive adhesive may be employed.

Figure 3D:
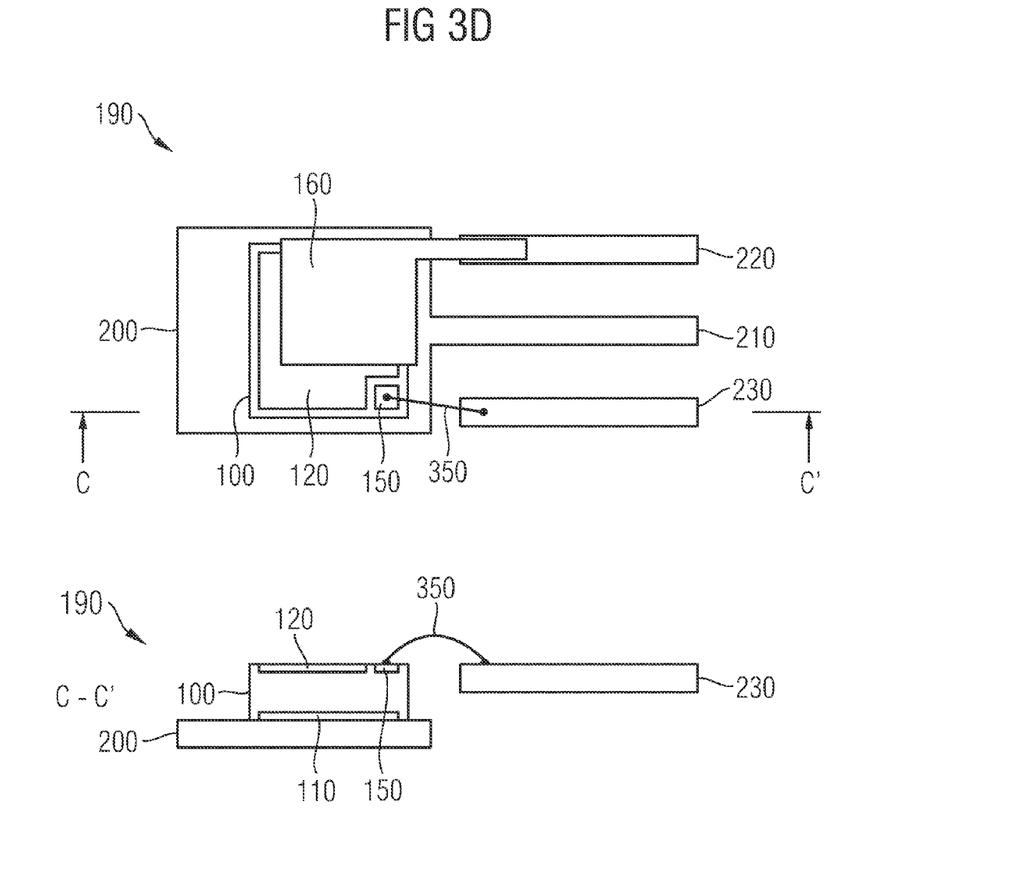

FIG. 3D schematically illustrates a bond wire 350 attached to the control electrode 150 of the power semiconductor chip 100 and the lead 230. For example, ball bonding or wedge bonding may be used as the interconnect technique to produce the bond wire 350.

Figure 3E:
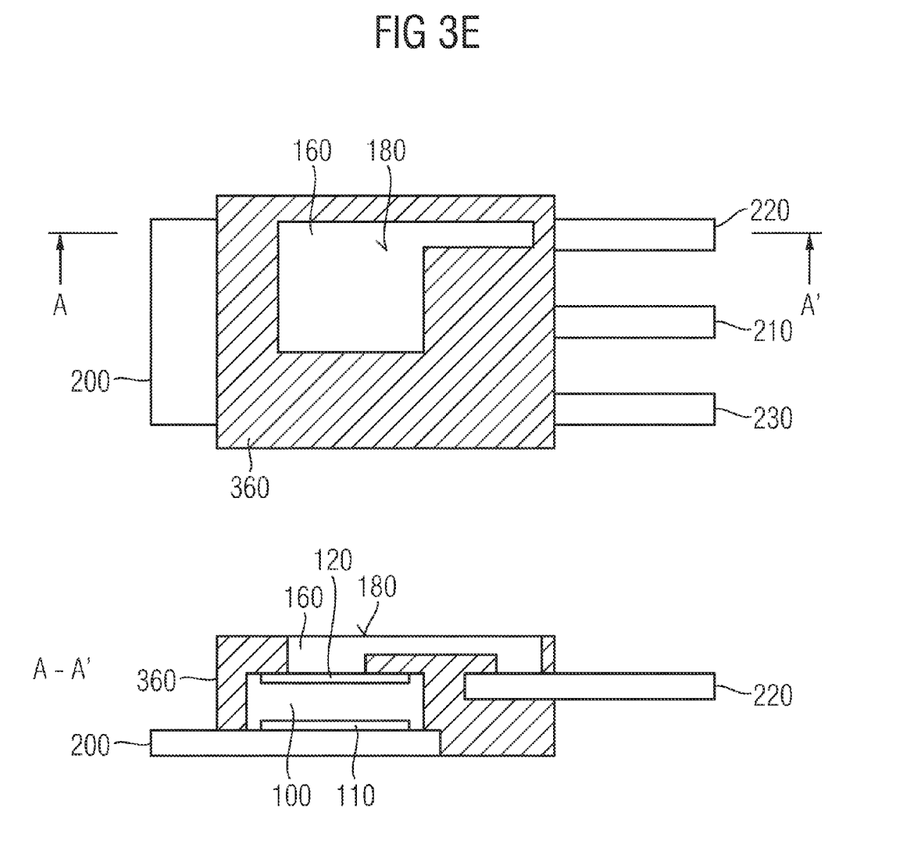
Figure 3F:
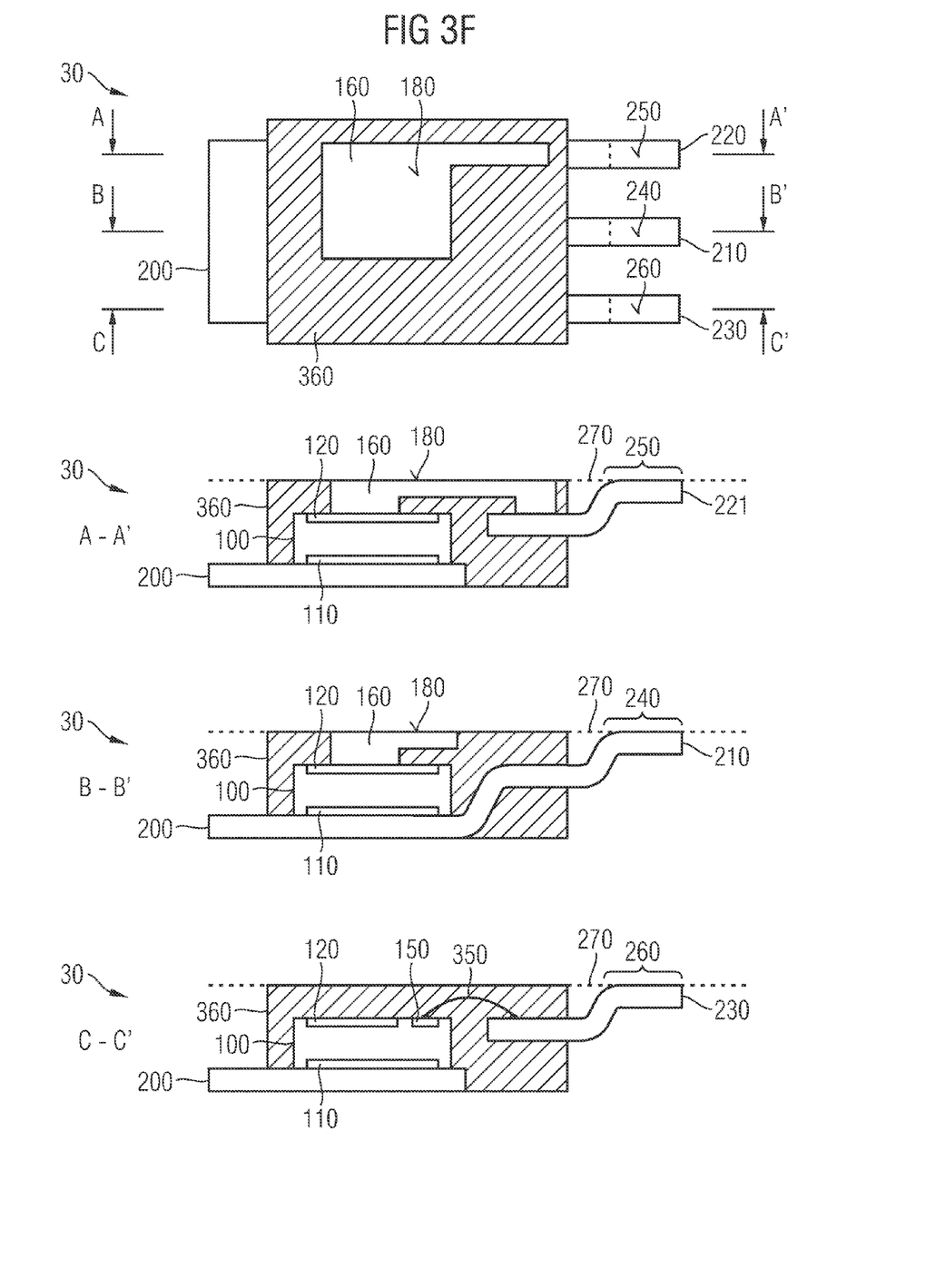

FIG. 3E schematically illustrates an encapsulation material 360 encapsulating any portion of the device 30, but leaving at least the upper surface 180 of the metal clip 160 and parts of the leads 210, 220 and 230 uncovered. Furthermore, parts of the die pad 200 are not covered with the encapsulation material 360, in particular, the bottom surface of the die pad 200. The top surface of the encapsulation material 360 forms a plane together with the top surface 180 of the metal clip 160.

A mold transfer process may be carried out to encapsulate the components arranged on the leadframe 190 with a mold material as the encapsulation material 360.

The mold material may be composed of any appropriate thermoplastic or thermosetting material, in particular, it may be composed of a material commonly used in contemporary semiconductor packaging technology. Various techniques may be employed to cover the components of the device 30 with the mold material, for example, compression molding, injection molding, powder molding or liquid molding.

Before or after the encapsulation with the mold material, the individual devices 30 are separated from one another by separation of the leadframe 190, for example, by sawing or cutting the dams of the leadframe 190. Other separation methods, such as etching, milling, laser ablation or stamping, may also be employed.

FIG. 3F schematically illustrates that the leads 210, 220 and 230 are bent, for example, in an S-shape manner to form a step as depicted in FIG. 3F. Bending the leads 210, 220 and 230 may, for example, be carried out in the course of a trim and form process. In one embodiment, the ends of the leads 210, 220 and 230 are bent in the direction of the metal clip 160. The leads 210, 220 and 230 are bent such that their top surfaces 240, 250 and 260, respectively, (illustrated in FIG. 3F by dashed lines) are arranged in a plane 270, which is defined by the exposed surface 180 of the metal clip 160 and, in particular, the top surface of the encapsulation material 360. It may be provided that the surface area of the exposed surface 180 of the metal clip 160, which is electrically coupled to the electrode 120 of the power semiconductor chip 100, is larger than the contact area of the surface 240 of the lead 210, which is electrically coupled to the electrode 110 of the power semiconductor chip 100.

The metal clip 160 and the leads 210, 220 and 230 serve as electrical terminals of the device 30. The surface 180 of the metal clip 160 and the surfaces 240, 250 and 260 of the leads 210, 220 and 230 are used to electrically couple the device 30 to other components, for example, a DCB substrate as described below.

Figure 4:
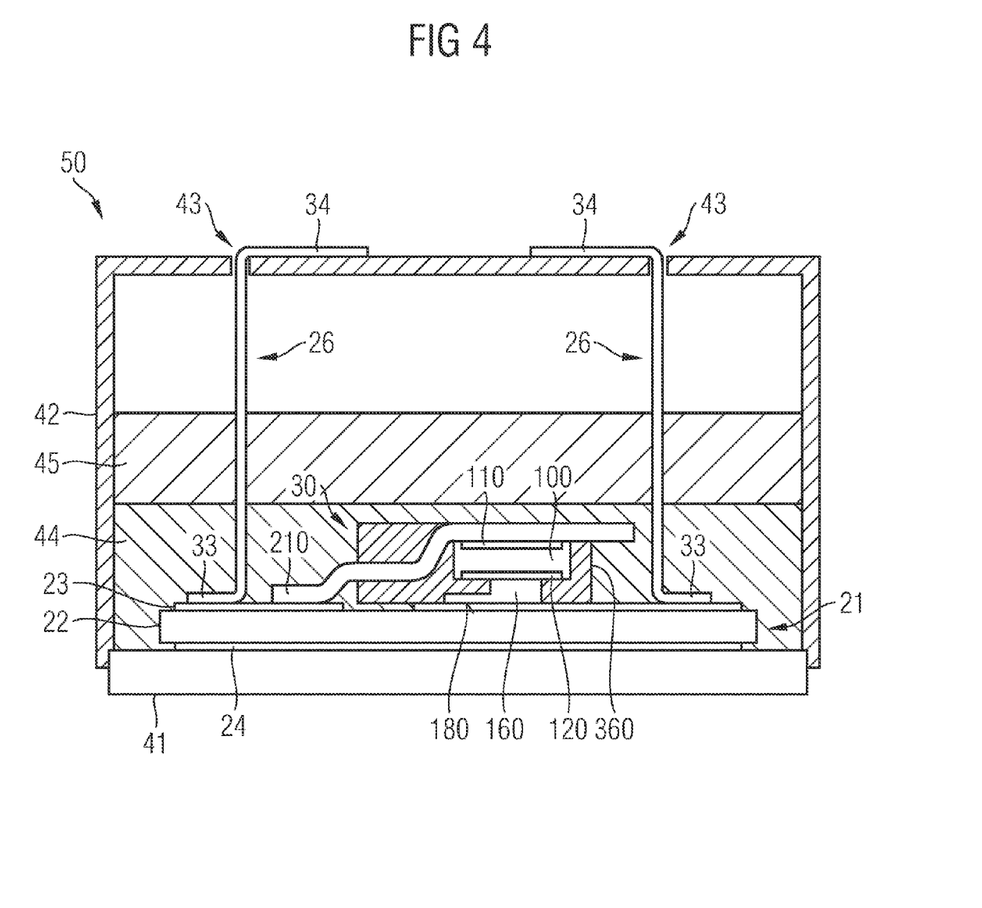
FIG. 4 schematically illustrates a cross-sectional view of one embodiment of a module including the discrete device illustrated in FIG. 3F mounted on a DCB substrate.

FIG. 4 schematically illustrates a cross-sectional view of a module 50 containing the discrete device 30 illustrated in FIG. 3F. The module 50 includes a DCB substrate 21 with a ceramic substrate 22 and copper layers 23, 24, wherein at least the upper copper layer 23 is structured. The device 30 is mounted on the copper layer 23 such that the leads 210, 220, 230 are in electrical contact with different copper pads of the copper layer 23. In addition, the DCB substrate 21 is mounted on a metal carrier 41, and a housing 42 is placed over the metal carrier 41 accommodating the DCB substrate 21 and the discrete device 30. Metal clips 26 are attached to the copper layer 23 and extend through openings 43 in the housing 42 to the upper surface of the housing 42, where the upper ends 34 of the metal clips 26 serve as external contact elements. The external contact elements allow electrical access to the leads 210, 220 and 230.

It is obvious that the discrete devices 25 and 30 illustrated in FIGS. 2G and 4 are only examples of discrete surface mount devices (SMD) that can be integrated into the modules 20 and 50. In general, other discrete surface mount devices can be integrated in the modules 20 and 50. Examples of such discrete devices are illustrated in FIGS. 5-7.

Figure 5:
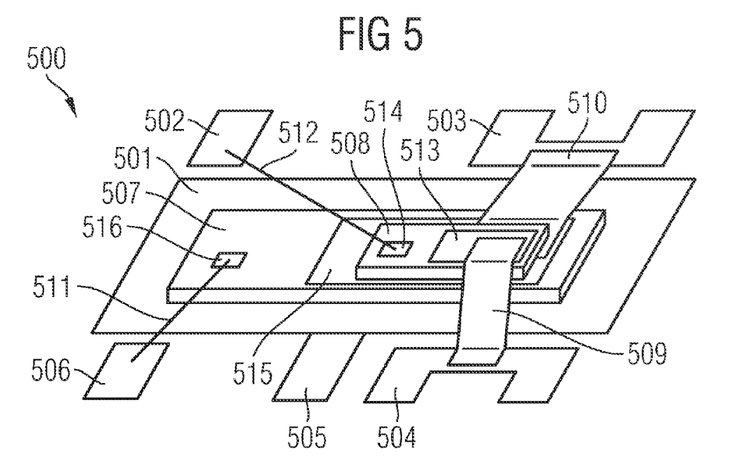
FIG. 5 schematically illustrates a perspective view of one embodiment of a discrete device including two power semiconductor chips stacked on top of each other.

FIG. 5 schematically illustrates a perspective view of a device 500 including a die pad 501, leads 502-506, power semiconductor chips 507, 508, metal clips 509, 510 and bond wires 511, 512. The power semiconductor chip 507 is mounted on the die pad 501 with its drain electrode facing the die pad 501. The metal clip 510 electrically couples a source electrode 515 of the power semiconductor chip 507 to the lead 503, and the bond wire 511 electrically couples a gate electrode 516 of the power semiconductor chip 507 to the lead 506. The power semiconductor chip 508 is placed over the metal clip 510 with its drain electrode facing the metal clip 510. A source electrode 513 of the power semiconductor chip 508 is electrically coupled to the lead 504 by the metal clip 509, and a gate electrode 514 of the power semiconductor chip 508 is electrically coupled to the lead 502 by the bond wire 512. The die pad 501 and the lead 505 are made in one piece. The die pad 501 and the power semiconductor chips 507, 508 are encapsulated by a mold material, which is not shown in FIG. 5.

Figure 6:
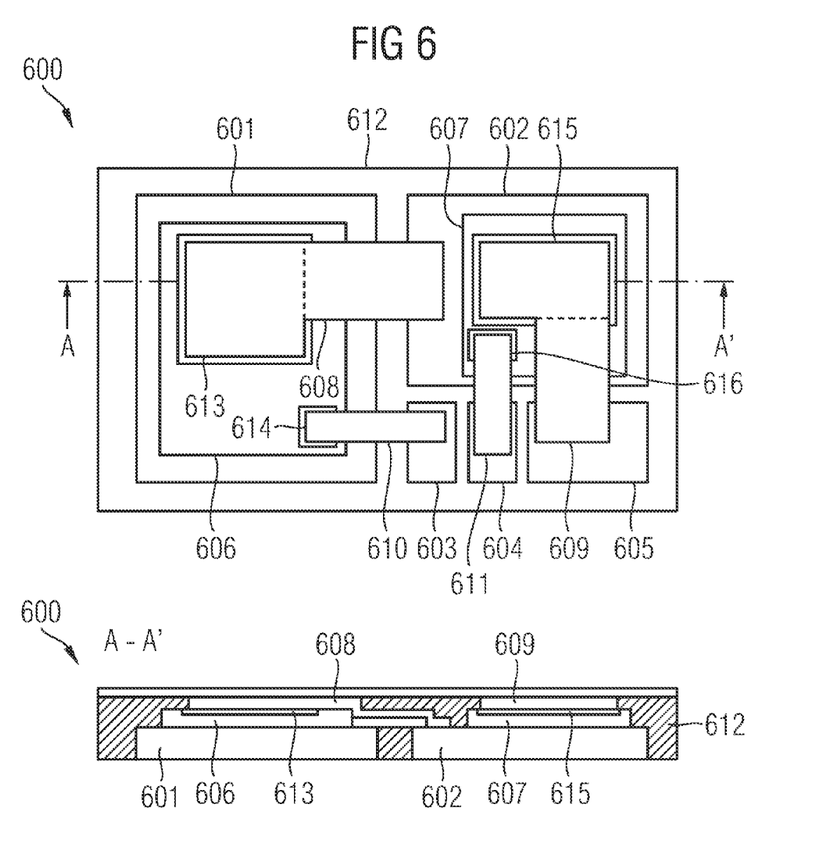
FIG. 6 schematically illustrates a cross-sectional and top plan view of one embodiment of a discrete device including two power semiconductor chips mounted on a leadframe.

FIG. 6 schematically illustrates a top plan view (top) and a cross-sectional view (bottom) along a line A-A' depicted in the top plan view of a device 600. The device 600 includes die pads 601, 602, leads 603-605, power semiconductor chips 606, 607, metal layers 608-611 and a mold material 612. The power semiconductor chips 606, 607 are mounted on the die pads 601, 602, respectively, with their drain electrodes facing the die pads 601, 602. The metal layers 608, 610 electrically couple a source electrode 613 and a gate electrode 614 of the power semiconductor chip 606 to the die pad 602 and the lead 603, respectively. The metal layers 609, 611 electrically couple a source electrode 615 and a gate electrode 616 of the power semiconductor chip 607 to the lead 605, 604, respectively. The mold material 612 covers the power semiconductor chips 606, 607. In one embodiment, the metal layers 608-611 are deposited by galvanic deposition methods. In one embodiment, the metal layers 608-611 are metal clips.

Figure 7:
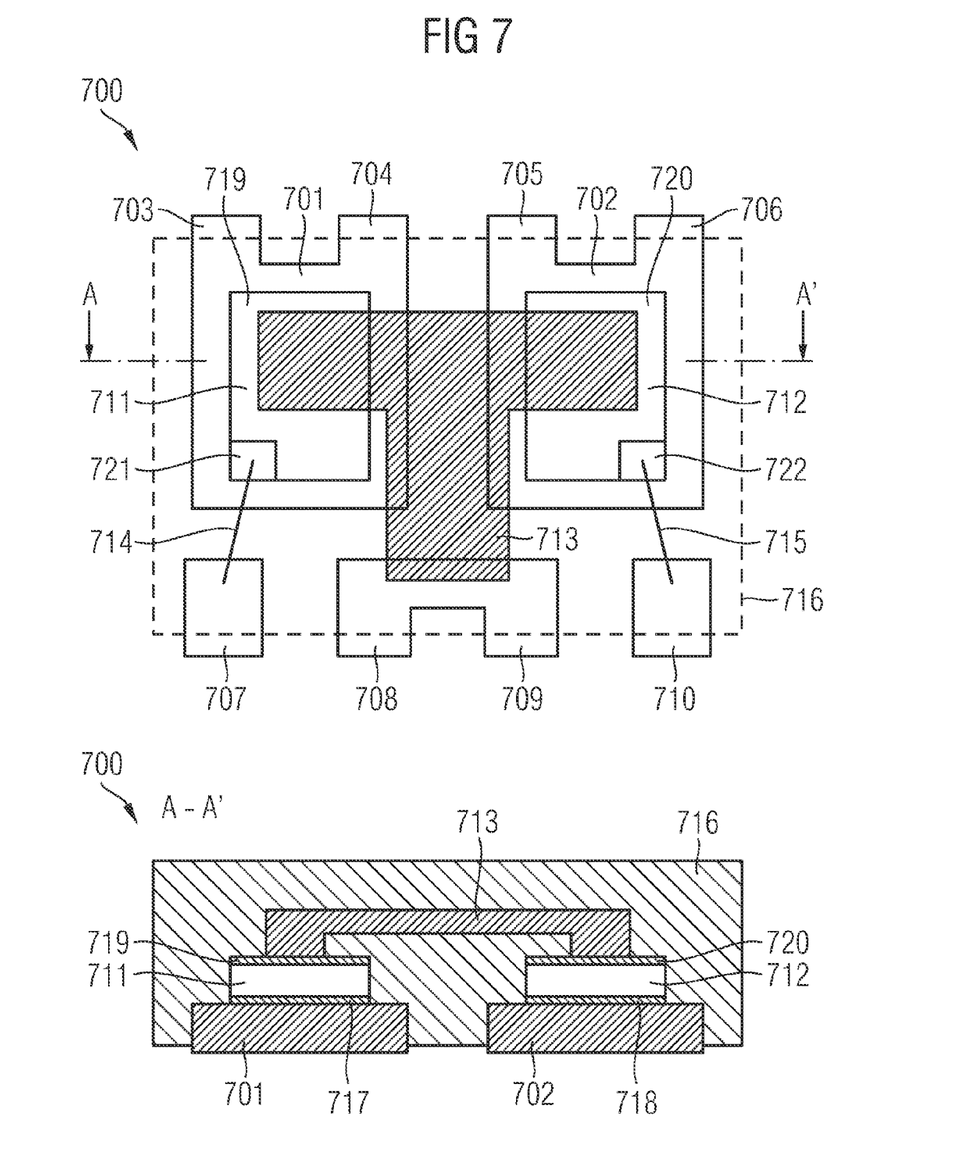
FIG. 7 schematically illustrates a cross-sectional and top plan view of one embodiment of a discrete device including two power semiconductor chips mounted on a leadframe.

FIG. 7 schematically illustrates a top plan view (top) and a cross-sectional view (bottom) along a line A-A' depicted in the top plan view of a device 700. The device 700 includes die pads 701, 702, leads 703-710, power semiconductor chips 711, 712, a metal clip 713, bond wires 714, 715 and a mold material 716. The power semiconductor chips 711, 712 are mounted on the die pads 701, 702 with their drain electrodes 717, 718 facing the die pads 701, 702, respectively. The metal clip 713 electrically couples source electrodes 719, 720 of the power semiconductor chips 711, 712 to the leads 708, 709. The bond wires 714, 715 electrically couple gate electrodes 721, 722 of the power semiconductor chips 711, 712 to the leads 707, 710, respectively. The mold material 716 covers the power semiconductor chips 711, 712. The die pad 701 and the leads 703, 704 are made in one piece. The die pad 702 and the leads 705, 706 are made in one piece. The leads 708, 709 are made in one piece.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module comprising:
   a metal carrier;
   a direct copper bonding (DCB) substrate, wherein the DCB substrate is mounted on the metal carrier;
   a discrete device mounted on the DCB substrate, wherein the discrete device comprises:
      a leadframe;
      a semiconductor chip mounted on the leadframe;
      an encapsulation material covering the semiconductor chip; and
      an electrical terminal protruding out of the encapsulation material and providing an electrical coupling between the semiconductor chip and the DCB substrate, wherein one end of the electrical terminal is attached to an electrode on a surface of the semiconductor chip and another end of the electrical terminal is attached to the DCB substrate;
   a housing placed on the metal carrier and accommodating the DCB substrate and the discrete device, wherein the discrete device is completely arranged inside the housing; and
   a metal clip, wherein one end of the metal clip is attached to the DCB substrate and another end of the metal clip is arranged outside the housing.

2. The module of claim 1, wherein the end of the metal clip that is arranged outside the housing is an external contact element.

3. The module of claim 1, wherein the semiconductor chip has a first face, and a second face opposite to the first face, wherein a first electrode is arranged on the first face and a second electrode is arranged on the second face.

4. The module of claim 1, wherein the semiconductor chip comprises a substrate made of silicon carbide.

5. The module of claim 1, further comprising a further semiconductor chip mounted on the DCB substrate.

6. The module of claim 5, wherein the semiconductor chip comprises a substrate made of silicon carbide and the further semiconductor chip comprises a substrate made of silicon.

7. The module of claim 1, further comprising a layer of silicone gel embedding the discrete device.

8. The module of claim 7, further comprising a layer of epoxy resin deposited on the layer of silicone gel.

9. The module of claim 1, further comprising a further discrete device mounted on the DCB substrate.

10. The module of claim 1, wherein the DCB substrate comprises a ceramic layer enclosed by two copper layers.

11. The module of claim 1, wherein the semiconductor chip is one of a power MOSFET, IGBT, JFET and power bipolar transistor.

12. The module of claim 1, wherein the discrete device is a surface mount device (SMD).

* * * * *